United States Patent [19]
Ohtoshi et al.

[11] Patent Number: 5,232,507
[45] Date of Patent: Aug. 3, 1993

[54] APPARATUS FOR FORMING DEPOSITED FILMS WITH MICROWAVE PLASMA CVD METHOD

[75] Inventors: Hirokazu Ohtoshi; Tetsuya Takei, both of Nagahama; Ryuji Okamura, Shiga; Yasuyoshi Takai, Nagahama, all of Japan

[73] Assignee: Canon Kabushiki Kaisha, Tokyo, Japan

[21] Appl. No.: 876,472

[22] Filed: Apr. 30, 1992

[30] Foreign Application Priority Data

May 1, 1991 [JP] Japan ................................ 3-126455

[51] Int. Cl.[5] ............................................ C23C 16/50
[52] U.S. Cl. .................... 118/719; 118/723; 118/725; 118/728; 118/730
[58] Field of Search ............... 118/715, 719, 723, 724, 118/725, 730, 733

[56] References Cited

U.S. PATENT DOCUMENTS

| | | | |
|---|---|---|---|
| 4,785,763 | 11/1988 | Saitoh | 118/715 X |
| 4,840,139 | 6/1989 | Takei | 118/733 X |
| 4,995,341 | 2/1991 | Matsuyama | 156/345 X |

FOREIGN PATENT DOCUMENTS 64-272 1/1989 Japan.
2-7730 1/1990 Japan ............................ 315/111.21

Primary Examiner—Brian E. Hearn
Assistant Examiner—Jonathan D. Baskin
Attorney, Agent, or Firm—Fitzpatrick, Cella, Harper & Scinto

[57] ABSTRACT

An apparatus for forming deposited films with a microwave plasma CVD method comprises a reactor vessel within which the pressure can be reduced, means for supplying a source gas into the reactor vessel, means for introducing the microwave into the reactor vessel and exciting a microwave discharge plasma, and means for holding a plurality of substrates so as to enclose a discharge space formed within the reactor vessel, and is characterized by comprising a holding member holding together dielectric windows for introducing the microwave into the reactor vessel, substrates for the formation of deposited films disposed so as to surround the dielectric windows and a cooling device for cooling the dielectric windows, and conveying means for conveying the holding member into and out of the reactor vessel in a vacuum atmosphere.

2 Claims, 4 Drawing Sheets

APPARATUS FOR FORMING DEPOSITED FILMS WITH MICROWAVE PLASMA CVD METHOD

BACKGROUND OF THE INVENTION

1. Field of the Invention

The present invention relates to an apparatus for forming deposited films with a microwave plasma CVD method in which the deposited films are formed on the surface of a substrate by introducing the microwave energy into a reactor vessel. More particularly, the invention relates to an apparatus for forming deposited films with a microwave plasma CVD method in which the deposited films are formed on a plurality of substrates simultaneously.

2. Related Background Art

For element members used for semiconductor devices, photoreceptor devices for electrophotography, line sensors for image input, image pickup devices, photovoltaic devices and so on, amorphous deposited films made of amorphous silicone compensated with hydrogen and/or halogen (e.g., fluorine, chlorine) have been proposed, and some of them have been put into practice.

Conventionally, a number of methods for forming such amorphous deposited films have been known, for example, a sputtering method, a heating CVD method in which a source gas is decomposed by heating, a photo assisted CVD method in which a source gas is decomposed with light, and a plasma CVD method in which a source gas is decomposed with plasma. Among them, the plasma CVD method, in which the source gas is decomposed by the direct current, the radio frequency, or the microwave glow discharge, deposited films like thin films are formed on a substrate made of, for example, glass, quartz, heat resistive synthetic resin film, stainless, or aluminum, has been widely used today for the formation of amorphous silicone deposited films for use in the photoreceptor for electrophotography. Especially in recent years, the microwave plasma CVD method using a microwave glow discharge decomposition has been noted for industrial purposes. The microwave plasma CVD method has an advantage of having a higher film deposition rate and a higher source gas utilization efficiency than other methods.

An example of the microwave plasma CVD method applying such an advantage has been disclosed in U.S. Pat. No. 4,504,518. This technology is to obtain good quality deposited films at a high film deposition rate by carrying out the microwave plasma CVD method at a low pressure of 0.1 Torr or less. Further, a technique for improving the utilization efficiency of source gas with the microwave plasma CVD method has been disclosed in Japanese Laid-Open Patent Application No. 60-186849. This technology is such that a plurality of cylindrical substrates are disposed to enclose an introduction portion for the microwave energy to form an inner chamber (or a film formation space), thereby greatly improving the utilization efficiency of source gas. In Japanese Laid-Open Patent Application No. 63-145781, there has been disclosed an apparatus for forming deposited films with an improved microwave plasma CVD method for forming functional deposited films. This apparatus for forming deposited films is such that a dielectric window through which the microwave is introduced into a film formation space is of a laminated structure, with a surface of the dielectric window facing a vacuum vessel being coarse, to improve the workability in exchanging this dielectric window, and to prevent the electrical resistance on the surface of films deposited on the dielectric window from decreasing, so that the microwave is prevented from reflecting at the surface of the dielectric window, thereby forming functional deposited films steadily at a high efficiency for a long term.

With these conventional techniques, it is possible to fabricate comparatively thick deposited films made of, for example, a photoconductive material at significantly great deposition rate and source gas utilization efficiency. An example of the apparatus for forming deposited films with such an improved conventional microwave plasma CVD method is shown in FIG. 4. This apparatus for forming deposited films is intended for the fabrication of photoreceptors for electrophotography. This point will be described below.

A reactor vessel 401 for the formation of deposited films is capable of evacuation, comprising an exhaust pipe 404 having one end thereof connected to exhaust means 406 such as a vacuum pump. An exhaust valve 405 is provided at an intermediate portion of this exhaust pipe 404. At central portions on an upper plane and a lower plane of the reactor vessel 401 are attached waveguides 403, respectively, each of which is connected via a stub tuner and an isolator, not shown, to a microwave power source, not shown. At an end portion of each waveguide 403 on the side of the reactor vessel 401 is disposed a respective dielectric window 402 to hold the vacuum within the reactor vessel 401. The dielectric window 402 is formed of a material (e.g., quartz glass, alumina ceramics) capable of transmitting the microwave power into the reactor vessel 401 efficiently and holding the vacuum airtightly.

A plurality of cylindrical substrates 407 are provided in parallel to each other, so as to surround a central portion of the reactor vessel 401. A space enclosed by the substrates 407 and the dielectric windows 402 within the reactor vessel 401 is a discharge space 408, within which a microwave plasma discharge is generated to form deposited films on the surfaces of the substrates 407.

Each substrate 407 is carried on a respective rotation shaft 419, which is connected to rotating means 412 such as a motor, wherein the substrate 407 rotates on its own axis when the rotation shaft 419 is driven by the rotating means 412. Also, each cylindrical substrate is provided with a heater 413 for heating the substrate so as to be inserted into the inside thereof.

Further, a source gas supply pipe 410 is provided to supply a source gas to the discharge space 408. The source gas supply pipe 410 is sealed at its top end portion, and provided with a number of holes on a lateral side of the top end portion, through which the source gas flows into the discharge space 410. The source gas supply pipe 410 is connected via a mass flow controller 409 to a source gas supply, not shown.

The operation of this conventional apparatus for forming deposited films with the microwave plasma CVD method will be described below.

First, a dry nitrogen gas or a dry argon gas at an atmospheric pressure is introduced into the reactor vessel 401, with the exhaust valve 405 closed, and then the reactor vessel 401 is opened and cleaned inside. Subsequently, cylindrical substrates 407 for the formation of deposited films are loaded into the reactor vessel 401. The substrates 407 are cleaned beforehand with an organic solvent such as trichloroethane to remove dirts such as oils or dusts on the surfaces. At the same time, the dielectric windows 402 sufficiently cleaned beforehand are attached to end portions of the waveguides 403 facing the reactor vessel 401.

Again, the reactor vessel 401 is closed and the exhaust valve 405 is opened to exhaust the reactor vessel 401, so that the internal pressure of the reactor vessel 401 is adjusted at a pressure of $1 \times 10^{-7}$ Torr or less.

Then, the substrates 407 are heated up to a temperature suitable for the film deposition by respective heaters 413, while introducing an argon gas, for example, into the reactor vessel 401. And via the source gas supply pipe 410, a source gas such as a silane gas, for example, if amorphous silicon deposited films are formed, is introduced into the reactor vessel 401. In parallel with the introduction of the source gas, a microwave energy having a frequency of 500 MHz or greater, and more preferably 2.45 GHz, is introduced from a microwave power source (not shown) via dielectric windows 402 into the reactor vessel 401. By doing so, the source gas is excited and dissociated by the microwave energy in the discharge space enclosed by the substrates 407, so that the deposited films are formed on the surface of each substrate 407. At this time, the deposited films are formed around the entire peripheral surface of each cylindrical substrate 407 by rotating the substrate 407 around a central axis thereof along its longitudinal direction by each rotating means 412 such as a motor.

With such a conventional apparatus for forming deposited films it is possible to obtain deposited films having practical characteristics and uniformities at a certain deposition rate, and further to obtain deposited films with significantly less defects by cleaning the reactor vessel strictly.

However, in the conventional apparatus for forming deposited films with the microwave plasma CVD method, as above described, when forming large and thick deposited films requiring uniform characteristics, which are used for a photoreceptor for electrophotography, for example, there is still room for improvement on the aspects of the characteristics and the economical efficiency of deposited films formed.

That is, since films having a thickness equal to or greater than that of deposited films on the substrates may be deposited on the surfaces of dielectric windows or the source gas inlet conduit, in an apparatus configuration of the conventional apparatus for forming deposited films, parts such as dielectric windows or the source gas inlet conduit must be exchanged every time one formation of deposited films is performed. Therefore, to exchange these parts or take out the substrates having the deposited films formed, the reactor vessel must be exposed to the atmosphere every time, so that work such as evacuation, heating of the substrates, cooling after the formation of deposited films, atmosphere leakage, take-out of the substrates, and cleaning are required, and it takes a lot of time to do this work. Thus, there is a problem that the tactics, and thus the cost, for forming deposited films will be increased.

Also, there is a further problem that since the reactor vessel is exposed to the atmosphere every time, molecules such as nitrogen, oxygen or water in the atmosphere may be adsorbed to the inner surface of the reactor vessel to cause adsorbed molecules to be mingled into deposited films, thereby decreasing the film quality. Further, there is another problem that since the substrates are loaded into the reactor vessel in the atmosphere, dust already existing within the reactor vessel may fly up in a process of evacuating the reactor vessel after loading, thereby adhering to the surfaces of the substrates, and causing defects on deposited films.

Further, when the microwave power introduced into the reactor vessel was increased to raise the deposition rate, the temperature rose too greatly on the surfaces of dielectric windows on the side of the film formation space, so that the dielectric windows were sometimes broken.

Along with the rapid development of technologies of a copying machine, a laser beam printer and so on, it is requisite to obtain deposited films having more excellent characteristics and lower cost, and it is currently required for the apparatus for forming deposited films to form deposited films in a shorter time, with the improved characteristics of deposited films formed, and reduced defects.

SUMMARY OF THE INVENTION

An object of the present invention is to provide an apparatus for forming deposited films which can resolve the above-mentioned problems.

Another object of the present invention is to provide an apparatus for forming deposited films with a microwave plasma CVD method, wherein deposited films having excellent characteristics are formed cheaply in a stable manner at higher speeds and with a good yield.

DETAILED DESCRIPTION OF THE PREFERRED EMBODIMENT

The preferred embodiment of an apparatus for forming deposited films with the microwave plasma CVD method according to the present invention is as follows.

That is, there is provided an apparatus for forming deposited films with the microwave plasma CVD method having a reactor vessel which is capable of reducing the pressure, means for supplying source gases into the reactor vessel, means for introducing the microwave into said reactor vessel and exciting a microwave discharge plasma, and means for holding a plurality of substrates so as to enclose a discharge space formed within said reactor vessel, characterized by comprising a holding member holding together dielectric windows for introducing the microwave into said reactor vessel, substrates for the formation of deposited films disposed so as to surround said dielectric windows and a cooling device for cooling said dielectric windows, and conveying means for conveying said holding member into and out of said reactor vessel in a vacuum atmosphere.

According to the present invention, the following effects can be provided.

(1) Taking the substrates into or out of the reactor vessel, and cleaning or exchanging the dielectric windows, can be easily made without exposing the reactor vessel to the atmosphere, so that the degradation of deposited films in the characteristics due to the exposure of the reactor vessel to the atmosphere can be prevented, the productivity can be improved, and the deposited films having more excellent characteristics can be formed more cheaply.

(2) Since the temperature elevation of the dielectric windows due to introducing the microwave energy can be suppressed, it is possible to prevent the dielectric windows from breaking.

(3) As the deposited films can be formed on the substrate more uniformly and at higher speeds, the productivity and the characteristics of the obtained films can be further improved.

The apparatus for forming deposited films according to the present invention will be described with reference to the drawings.

Figure 1:
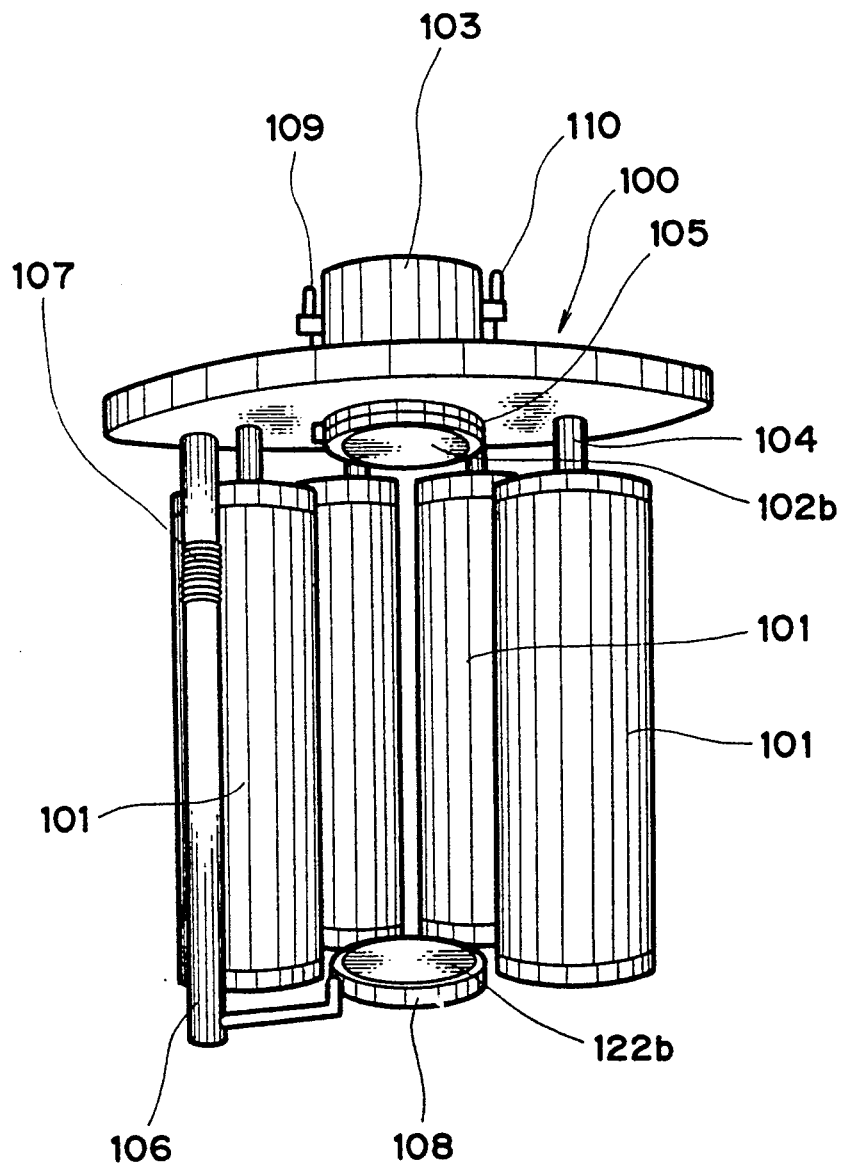
FIG. 1 is a schematic view illustrating an example of a holding member in an apparatus for forming deposited films with the microwave plasma CVD method according to the present invention.

FIG. 1 is a schematic view illustrating an example of the holding member in the apparatus for forming deposited films according to the present invention.

Figure 2:
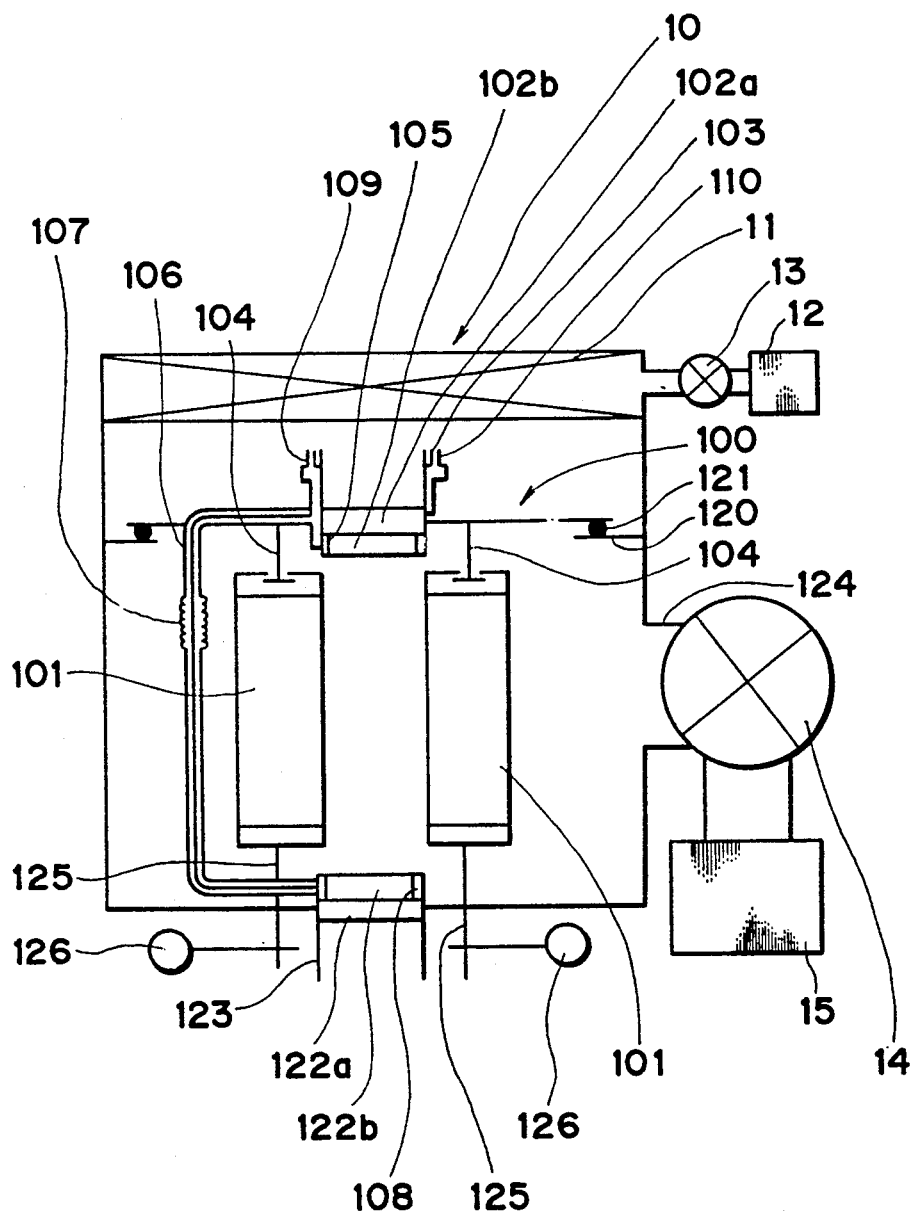
FIG. 2 is a schematic view illustrating an example of a reactor vessel in the apparatus for forming deposited films with the microwave plasma CVD method according to the present invention.

FIG. 2 is a schematic view illustrating an example of a configuration of the reactor vessel in the present invention.

Figure 3:
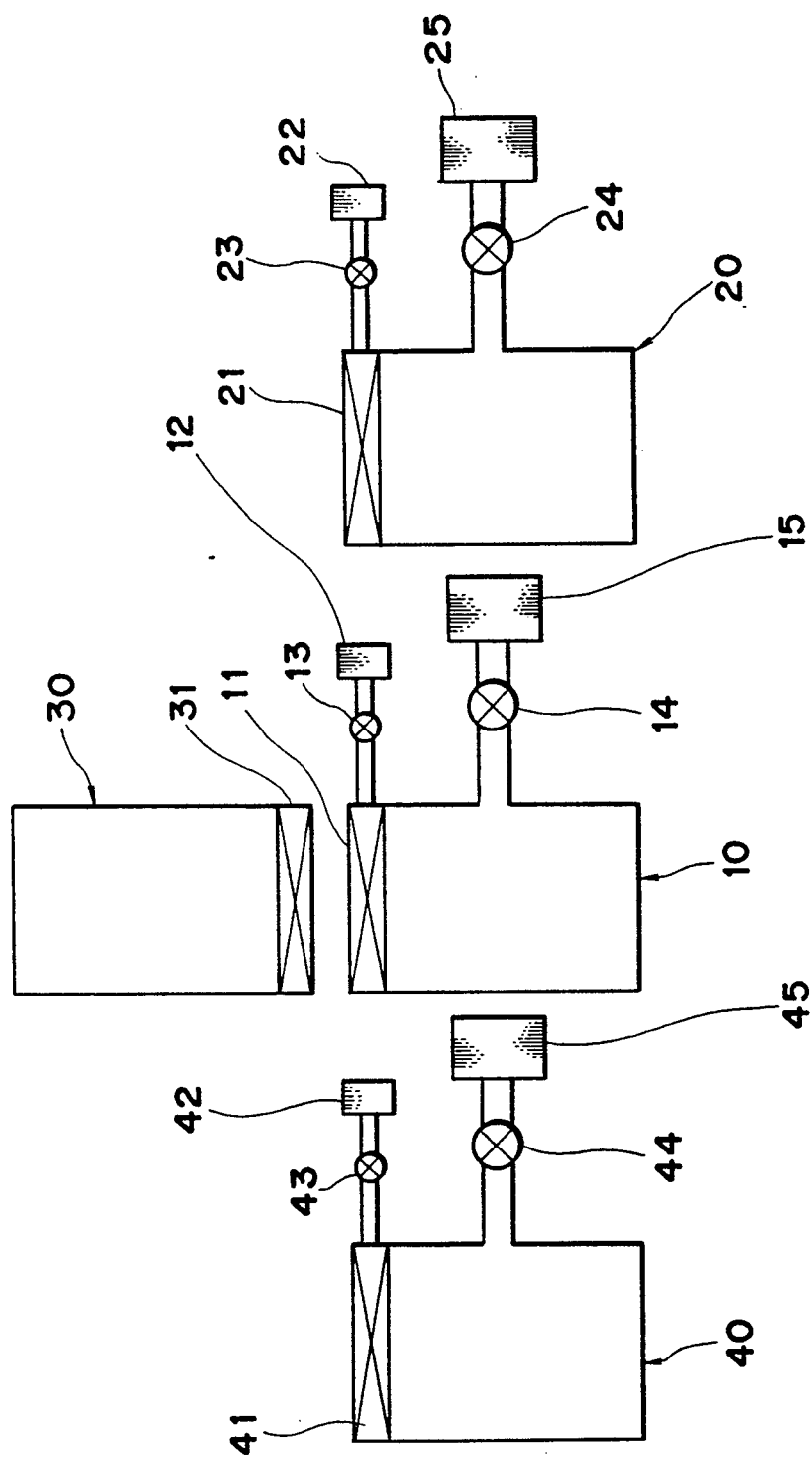
FIG. 3 is a schematic view illustrating an example of the apparatus for forming deposited films with the microwave plasma CVD method according to the present invention.

FIG. 3 is a schematic view illustrating an overall arrangement of the apparatus for forming deposited films.

The apparatus for forming deposited films with the microwave plasma CVD method as will be described below is a system comprised of a reactor vessel 10 for the formation of deposited films, a vacuum vessel 20 for the heating, a vacuum vessel 30 for the transportation, and a vacuum vessel 40 for the cooling, as shown in FIG. 3. The vacuum vessel 20 for the heating is one for heating cylindrical substrates 101 (FIGS. 1 and 2), on which the deposited films are formed, up to a suitable temperature, by receiving the substrates 101 incorporated into the holding member 100 as will be described later (FIGS. 1 and 2). The vacuum vessel 40 for the cooling is to cool the substrates 101, on which the deposited films are formed, in a vacuum atmosphere. The vacuum vessel 30 for the transportation is to transport the substrates 101 in the vacuum atmosphere between the vacuum vessel 20 for the heating, the reactor vessel 10, and the vacuum vessel 40 for the cooling, while holding the substrates 101 within the holding member. The details for the reactor vessel 10, and the vacuum vessels 20, 30, 40 for the heating, the transportation and the cooling, will be described later.

First, the cylindrical substrates 101 and the holding member 100 for holding them will be described with reference to FIGS. 1 and 2.

The holding member 100 is a disk-like member, on a substantially central portion of which a short cylindrical waveguide 103 is mounted. A first dielectric window 102a, constituting a microwave inlet portion, is sealed airtightly on a mounting portion of this waveguide 103. Also, a second dielectric window 102b is detachably mounted so as to make contact with a lower surface of the dielectric window 102a. These two sheets of dielectric windows 102a, 102b are disk-like members made of a material transparent to the microwave. The second dielectric window 102b is held on a first cooling jig 105 having a flow passage formed inside for passing the refrigerant for cooling.

A plurality of cylindrical substrates 101, on which the deposited films are formed, are suspended detachably and rotatably at one ends of hangers 104, respectively, so that each hanger 104 may be positioned on an extended line of the central axis along the longitudinal direction. The hangers 104 are mounted onto the holding member 100 by means of screws, for example, so as to be vertical to the holding member 100 and spaced from each other at an equal interval on the same circle around the dielectric windows 102a, 102b. Accordingly, the substrates 101 are held by the holding member 100 so that they surround the dielectric windows 102a, 102b and are parallel to each other.

Further, a conduit 106 serving as a passage for the refrigerant such as cooling water is provided vertically to the holding member 100, that is, in parallel to the cylindrical substrates 101. At a top end portion of the conduit 106, a second ring-like cooling jig 108 is provided opposed to the first cooling jig 105. The second cooling jig 108 is to hold and cool a detachable fourth dielectric window 122b which makes contact with an upper plane of a third dielectric window 122a sealed airtightly on a lower plane of the reactor vessel 10, as will be described later, and has the same configuration as the first cooling jig 105. Halfway up conduit 106 is provided a spring mechanism 107 such as bellows, so that the fourth dielectric window 122b attached to the second cooling jig 108 is maintained in contact with the third dielectric window 122a, even if temperature change takes place during the formation of deposited films.

The refrigerant, from a pipe connected to a refrigerant circulation device not shown which is refrigerant circulating means, flows into a refrigerant inlet port 109 provided adjacent to an outer wall of the waveguide 103, and passes via the first cooling jig 105, the conduit 106, the second cooling jig 108, and the conduit 106, out of a refrigerant outlet port 110 provided adjacent to an outer wall of the waveguide 103 to return to the refrigerant circulation device.

The reactor vessel 10 for the formation of deposited films will be described below with reference to FIG. 2.

The reactor vessel 10 has an upper end face opened, on which a gate valve 11 is attached. This gate valve 11 can be placed into close contact with another gate valve 31 provided on the vacuum vessel 30 (FIG. 3) for the transportation which is conveying means, and serves as inlet and outlet ports for the substrates 101 held on the holding member 100, when carrying them into or out of the reactor vessel 10, in cooperation with the gate valve 31. This gate valve 11 is connected via an exhaust valve 13 to exhaust means 12 for exhausting a space between both gate valves 11, 31, when brought into contact with the gate valve 31 in the vacuum vessel 30 for the transportation.

The reactor vessel 10 is provided internally with a flange 120 having a circular central opening at an upper portion thereof, and a vacuum seal member 121 such as an O-ring on an upper surface of the flange 120 so as to encircle its central opening. The central opening is slightly smaller in size than the holding member 100, and covered by the holding member 100, so that the reactor vessel 10 can be sealed, as described in connection with FIG. 1. The substrates 101 can be loaded in the reactor vessel 10 in such a manner that the substrates 101 may be positioned inside of the reactor vessel 10 or beneath the holding member 100, as shown, when the central opening of the flange 120 is enclosed by the holding member 100. The reactor vessel 10 has an exhaust pipe 124 connected thereto, which is connected via an exhaust valve 14 to exhaust means 15 such as an exhaust pump at its other end portion. The mounting position of the exhaust pipe 124 on the reactor vessel 10 is lower than that of the flange 120.

A cylindrical waveguide 123 is mounted substantially at a central portion on a bottom plane of the reactor vessel 10. The third dielectric window 122a is sealed airtightly on a mounting portion of the waveguide 123, thereby forming a microwave introducing portion. The third dielectric window 122a is placed into contact with the fourth dielectric window 122b held on the second cooling jig 108 of the holding member 100, when the substrates 101 are loaded into the reactor vessel 10 by the holding member 100. The third and fourth dielectric windows 122a, 122b are made of a material transparent to the microwave.

The third and fourth dielectric windows 122a, 122b are placed in the opposed relation to the first and second dielectric windows 102a, 102b, when the holding member 100 encloses the central opening of the flange 120. The arrangement of these dielectric windows 102a, 102b, 112a, 112b and the substrates 101 loaded into the reactor vessel 10 should constitute a resonant cavity for the microwave.

The overall configuration of the apparatus for forming deposited films with the microwave plasma CVD method will be described below by way of an example in connection with FIG. 3.

This apparatus for forming deposited films consists of a vacuum vessel 20 for the heating, a vacuum vessel 30 for the transportation, and a vacuum vessel 40 for the cooling, in addition to a reactor vessel 10, as above described. The configuration of the vacuum vessels 20, 40 for the heating and the cooling is substantially the same as that of the reactor vessel 10, as above described, except that the dielectric windows are not provided on the bottom face of the vacuum vessel and the source gas supply pipe is not provided. Heating means (not shown) for heating the substrate 101 is provided inside the vacuum vessel 20 for the heating. Accordingly, the vacuum vessels 20, 40 for the heating and the cooling are provided with gate valves 21, 41 on their upper end faces, respectively, which are connected via valves 23, 43 to exhaust means 22, 42, respectively. Further, the vacuum vessels 20, 40 for the heating and the cooling are connected via valves 24, 44 to exhaust means 25, 45, respectively. Note that the reactor vessel 10, and the vacuum vessels 20, 40 for the heating and the cooling are stationary. At least the vacuum vessel 20 for the heating is installed in a clean room.

On the other hand, the vacuum vessel 30 for the transportation can be moved by driving means not shown, and is provided with a gate valve 31 on its lower end plane. This gate valve 31 can be placed into contact with the gate valves 11, 21, 41 provided on the reactor vessel 10, and the vacuum vessels 20, 40 for the heating and the cooling, respectively, and serves as an inlet/outlet port for carrying the substrates into or out of the reactor vessel 10, the vacuum vessels 20, 40 for the heating and the cooling, or the vacuum vessel 30 for the transportation in the vacuum atmosphere, with the substrates 101 held on the holding member 100. Inside the vacuum vessel 30 for the transportation, there is provided an elevating mechanism (not shown) for delivering the holding member holding the substrates 101 through the gate valve 31, and further exhaust means not shown such as a vacuum pump is connected to the vacuum vessel 30 for the transportation. Although one reactor vessel 10 and one vacuum vessel 30 for the transportation are provided, a plurality of reactor vessels and a plurality of vacuum vessels for the transportation may be provided. The number of them can be appropriately selected in the design, taking into consideration the films to be formed and the operativity.

The operation of the apparatus for forming deposited films with the microwave plasma CVD method will be described below.

First, hangers 104 are secured to the holding member 100, and the second and fourth dielectric windows 102b, 122b which are sufficiently cleaned beforehand are mounted on the first and second cooling jigs 105, 108, respectively. Subsequently, cylindrical substrates 101 with their surfaces precut by a diamond cutting tool and sufficiently cleaned with an organic solvent such as trichloroethane are suspended from the hangers 104 to mount the substrates 101 on the holding member 100. These works are preferably performed in a clean room where there is significantly less dust.

Next, the holding member 100 holding the substrates 101 is brought into the vacuum vessel 20 for the heating, which is then exhausted by exhaust means 25 with the gate valve 21 closed. If the vacuum vessel 20 for the heating is exhausted, the substrates 101 are heated by heating means (not shown) installed within the vacuum vessel 20 for the heating. If the substrates 101 are heated up to a desired temperature, the vacuum vessel 30 for the transportation which has been exhausted beforehand by exhausting means not shown is moved to a position directly above the vacuum vessel 20 for the heating, so that the gate valve 31 provided on the vacuum vessel 30 for the transportation is placed into close contact with the gate valve 21 provided on the vacuum vessel 20 for the heating. And a space between both gate valves 21, 31 is exhausted by exhausting means 22 connected to the gate valve 21. If this space is exhausted, both gate valves 21, 31 are opened to accommodate the holding member 100 holding the substrates 101 within the vacuum vessel 30 for the transportation using the elevating mechanism not shown, and then both gate valves 21, 31 are closed.

Subsequently, the vacuum vessel 30 for the transportation which accommodates the holding member 100 and the substrates 101 is moved to a position directly above the reactor vessel for the formation of deposited films. The reactor vessel 10 has been exhausted beforehand by the exhausting means 15. The gate valve 31 provided on the vacuum vessel 30 for the transportation is placed into close contact with the gate valve 11 provided on the reactor vessel 10, and a space between both gate valves 11, 31 is exhausted by exhausting means 12. If this space is exhausted, both gate valves 11, 31 are opened to transfer the holding member 100 holding the substrates 101 from the vacuum vessel 30 for the transportation to the reactor vessel 10, using the elevating mechanism not shown, and then both gate valves 11, 31 are closed. By doing so, the substrates 101 are loaded into the reactor vessel 10. Thereafter, the vacuum vessel 30 for the transportation is moved sideways of the position directly above the reactor vessel 10.

If it is confirmed that the holding member 100 correctly encloses the central opening of the flange 120 in the reactor vessel 10, the gate valve 11 is opened to subject a portion above the flange 120 in the reactor vessel 10 to an atmospheric pressure. A vacuum seal member 121 such as an O-ring is provided around the central opening to cause the holding member 100 to press the vacuum seal member 121 against the flange 120 owing to the atmospheric pressure, so that there occurs no vacuum leakage between the holding member 100 and the flange 120. In this state, the fourth dielectric window 122b mounted on the second cooling jig 108 of the holding member 100 is placed into contact with the third dielectric window 122a sealed airtightly on the bottom face of the reactor vessel 10, under the action of a spring mechanism 107 provided on the conduit 106. Each rotation shaft 125 is engaged in a lower end portion of the cylindrical substrate 101.

Next, the waveguide 103 mounted on the holding member 100 and the waveguide 123 mounted on the bottom face of the reactor vessel 10 are connected to a waveguide (not shown), which is in turn connected via a stub tuner and an isolator to a microwave power source not shown. Also, pipes connected to a refrigerant circulation device not shown are connected at a refrigerant inlet port 109 and a refrigerant outlet port 110 provided on the holding member 100.

Source gases are introduced through a source gas supply pipe (not shown), while the substrates 101 are rotating on their own axes around respective rotational shafts 125 by motors 126, and the microwave having a frequency of 500 MHz or greater, and preferably 2.45 GHz, is introduced through the waveguide 103 via the dielectric windows 102a, 102b, 122a, 122b into the reactor vessel 10, while a predetermined degree of vacuum is maintained by adjusting the opening degree of the valve 14 connected to exhausting means 15. Thereby, a microwave plasma discharge is generated in a space or a film formation space surrounded by the substrates 101 and the second and fourth dielectric windows 102b, 122b, the source gases are decomposed, and the deposited films are formed on the substrates 101. A predetermined time after the start of discharging, that is, if the temperature of the second and fourth dielectric windows 102b, 122b has risen to some degree, the refrigerant circulation device not shown is activated. The refrigerant is circulated such that it flows into the refrigerant flow inlet port 109 via the first cooling jig 105, the conduit 106, the second cooling jig 108 and the conduit 106 out of the refrigerant flow outlet port 110, thereby cooling the second and fourth dielectric windows 102b, 122b mounted on the first cooling jig 105 and the second cooling jig 108, respectively. Therefore, the temperature elevation of the second and fourth dielectric windows 102b, 122b due to the microwave plasma discharge can be suppressed, so that the dielectric windows 102b, 122b will not be broken. Of course, since the first and third dielectric windows sealed airtightly to the waveguides 103, 123 respectively are not exposed directly to the plasma discharge, the temperature will not elevate to break the dielectric windows.

If the deposited films having predetermined thicknesses are formed on the substrates 101, the introduction of the microwave, the supply of source gases, and the circulation of the refrigerant are stopped, the rotation of the substrates 101 is stopped, and the waveguides 103, 123 are disconnected from the waveguide (not shown) connected to the microwave power source (not shown). Also, the pipes connected to the refrigerant circulation device not shown are uncoupled from the refrigerant flow inlet port 109 and the refrigerant flow outlet port 110. Subsequently, the vacuum vessel 30 for the transportation which has been exhausted beforehand by exhausting means not shown is moved to a position directly above the reactor vessel 10 so as to bring the gate valve 31 on the vacuum vessel 30 for the transportation into close contact with the gate valve 11 on the reactor vessel 10. As the gate valve 11 provided on the reactor vessel 10 is in an open state, a space upward of the flange 120 and a space between both gate valves 11, 31 in the reactor vessel 10 are exhausted if the exhausting means 12 connected to the gate valve 11 is activated. If these both spaces are exhausted, the gate valve 31 provided on the vacuum vessel 30 for the transportation is opened, and the substrates 101 having the deposited films formed, as well as the holding member, are accommodated into the vacuum vessel 30 for the transportation, by means of the elevating mechanism not shown. Then, both gate valves 11, 31 are closed.

Next, the vacuum vessel 30 for the transportation which accommodates the substrates 101 having the deposited films formed and the holding member 100 is moved to a position directly above the vacuum vessel 40 for the cooling. The vacuum vessel 40 for the cooling is exhausted beforehand by the exhausting means 45. The gate valve 31 provided on the vacuum vessel 30 for the transportation is placed into close contact with the gate valve 41 provided on the vacuum vessel 40, and a space between both gate valves 41, 31 is exhausted by exhausting means 42. If this space is exhausted, both gate valves 31, 41 are opened to transfer the holding member 100 holding the substrates 101 from the vacuum vessel 30 for the transportation to the vacuum vessel 40 for the cooling, using the elevating mechanism not shown, and then both gate valves 31, 41 are closed. Then, the substrates 101 are left intact and cooled in the vacuum vessel 40 for the cooling. If the substrates 101 are cooled down roughly to room temperature, the atmosphere is introduced into the vacuum vessel 40 for the cooling, the gate valve 41 is opened to take out the substrates 101, as well as the holding member 100, so that finished products of the substrates having the deposited films formed are obtained. It should be noted that the second and fourth dielectric windows 102b, 122b may be also detached and cleaned for the reuse in forming the deposited films the next time.

By repeating the above operation, it is possible to form the deposited films on the substrates consecutively and efficiently.

The material of the holding member for holding the cylindrical substrates 101 may be arbitrary, as long as it has a strength enough to hold a plurality of substrates 101 and the second and fourth dielectric windows 102b, 122b and an ability of retaining a vacuum therein, and examples of such material include a metal such as stainless steel, Al, Cr, Mo, Au, In, Nb, Te, V, Ti, Pt, Pd, Fe, and its alloy, ceramica, and resin. From the viewpoint of the strength and the price, stainless steel or Al is suitable. Its shape is not necessarily restricted.

Further, the method for holding the cylindrical substrates 101 on the holding member 100 may be arbitrary as long as it does not impede the rotational motion of the substrate 101 within the reactor vessel 10, and examples of such method include a method of suspending them with hangers, as above described, a method of suspending them with hooks, and a method of grasping them with arms. The method for mounting the second and fourth dielectric windows 102b, 122b onto the cooling jigs 105, 108 respectively may be also arbitrary as long as it assures sufficient positional accuracies within the reactor vessel 10.

Examples of the material for the dielectric windows 102a, 102b, 122a, 122b include materials with small microwave loss, such as alumina ($Al_2O_3$), aluminum nitride, (AlN), boron nitride (BN), silicon carbide (SiC), silicon oxide ($SiO_2$), beryllium oxide (BeO), polytetrafluoroethylene, and polystyrene.

The refrigerant for cooling the dielectric windows 102a, 102b, 122a, 122b may be water or alcohol, but water is preferable from the point of the cost. When the temperature of the refrigerant is too low, the films deposited on the second and fourth dielectric windows 102b, 122b become two-dimensional polymer films, which may be exfoliated if the formation time of the deposited films is too long, causing defects on the deposited films. On the other hand, when the temperature of the refrigerant is too high, the cooling ability will be insufficient, so that the temperatures of the second and fourth dielectric windows 102b, 122b on the discharge side rise due to the microwave discharge, and the second and fourth dielectric windows 102b, 122b are more likely to break. Accordingly, the temperature of the refrigerant is preferably from 10° C. to 60° C.

The conduit 106 mounted on the holding member 00 through which the refrigerant is passed is preferably made of a material to withstand its use in the vacuum and having a sufficient strength, for example, stainless steel, because if it breaks, the refrigerant may scatter into the reactor vessel 10 in the vacuum. If the conduit 106 is disposed within the film formation space, the deposited films will be also formed on the surface of the conduit 106, thereby decreasing the use efficiency of the source gas and requiring a longer time for the cleaning, whereby it is necessary that the conduit 106 is disposed outside the film formation space. The refrigerant flow inlet port and the refrigerant flow outlet port at which the pipes connected to the refrigerant circulation device are coupled to circulate the refrigerant are desirably of a one-touch joint structure, for example, so that the pipes may be readily coupled and uncoupled.

The time taken from the start of introducing the microwave into the reactor vessel 10 to the start of circulating the refrigerant is preferably from zero minutes (i.e., the introduction of microwaves and the circulation of refrigerant are started simultaneously) to several minutes, depending on the temperature of the refrigerant and the output of the microwave.

Heating means provided within the vacuum vessel 20 for the heating to heat the cylindrical substrates 101 may be heat generating element in the vacuum service specification, and specific examples thereof include an electrical resistance heating element such as a sheath-like wind heater, a plate-like heater, and a ceramic heater, a heat radiation lamp heating element such as a halogen-tungsten lamp, and an infrared lamp, and a heating element with heat exchanger means having the liquid or gas as a temperature medium. The surface material of the heating means may be a metal such as stainless steel, nickel aluminum, and copper, ceramics, and a heat resistant polymer resin.

In the above embodiment, the substrates 101 are introduced in a vacuum within the vacuum vessel 20 for the heating, but it will be appreciated that a separate vacuum vessel for introducing the substrates into the vacuum may be provided, apart from the vacuum vessel 20 for the heating, whereby the substrates 101 are first introduced into the vacuum within this vacuum vessel, and then conveyed into the vacuum vessel 20 for the heating in the vacuum atmosphere. Further, it is possible to cool the substrates 101 having the deposited films formed thereon in the reactor vessel 10 or the vacuum vessel 30 for the transportation, without providing the vacuum vessel 40 for the cooling. It is also possible to take out the substrates immediately after the formation of the deposited films, particularly without cooling them, depending on the temperature of the substrates in forming the deposited films.

Any temperature of the substrates 101 in forming the deposited films may be effective, but when amorphous silicon is deposited, the temperature is preferably from 20° C. to 500° C., and more preferably from 50° C. to 450° C. to obtain more excellent effects.

Examples of the material of the substrates 101 include a metal such as stainless steel, Al, Cr, Mo, Au, In, Nb, Te, V, Ti, Pt, Pd, and Fe, and its alloy, a synthetic resin with its surface treated for better conductance, such as polycarbonate, glass, ceramics, and paper.

Examples of the source gas for the formation of deposited films include a source gas for the formation of amorphous silicon such as silane ($SiH_4$) and disilane ($Si_2H_6$), a source gas for the formation of functional deposited films such as germane ($GeH_4$), and its mixed gas thereof. Examples of the dilution gas for adjusting the densities of constituents contained in the source gas include hydrogen ($H_2$), argon (Ar), and helium (He).

Examples of the characteristics improving gas for changing the band gap width of the deposited films include a gas containing nitrogen atoms such as) nitrogen ($N_2$), ammonia ($NH_3$), a gas containing oxygen atoms such as oxygen ($O_2$), nitrogen oxide (NO), nitrous oxide ($N_2O$), a gas containing hydrocarbon such as methane ($CH_4$), ethane ($C_2H_6$), ethylene ($C_2H_4$), acetylene ($C_2H_2$), propane ($C_3H_8$), a gas containing fluorine compound such as silicon tetrafluoride ($SiF_4$), disilicon hexafluoride ($Si_2F_6$), germanium tetrafluoride ($GeF_4$), and their mixed gas.

The present invention is also effective even if a dopant gas such as diborane ($B_2H_6$), boron trifluoride ($BF_3$), or phosphine ($PH_3$) is introduced into the vacuum vessel for the formation of deposited films simultaneously.

The experimental examples performed with the present invention will be described in contrast to the comparative examples.

EXPERIMENTAL EXAMPLE 1

Using an apparatus for forming deposited films with the microwave plasma CVD method of this embodiment as shown in FIGS. 1 to 3, amorphous silicone deposited films were formed. The films were formed in such a manner that a silane gas was introduced as a source gas by the amount of 700 sccm, the microwave energy of 2 kW was entered through upper and lower dielectric windows into the reactor vessel, and the discharge was maintained for two hours. After the formation of deposited films, the number of spheroidal projections on the amorphous silicone deposited films obtained was measured. The measurement of spheroidal projections was performed in such a manner as to select three circumferential areas at upper, medium and lower portions in the longitudinal direction for one cylindrical substrate, selecting three measuring points for each area, i.e., nine measuring points in total, and summing the number of spheroidal projections having a diameter of 20 μm or greater and existing within the area of 1 square meters at each measuring point. Then, the time from the start of microwave discharge to the start of passing water flow for cooling the dielectric windows was changed, and the relation between this time and the number of spheroidal projections was examined. Note that the cooling water temperature was 25° C. The results are shown in Table 1. Note that in this table, the minus value in the column of the time from the start of microwave discharge to the start of passing the water flow indicates that the water has already flowed before the start of discharge.

TABLE 1

| Time from the start of discharge to the start of cooling water flow (minute) | Number of spheroidal projections per 9 cm$^2$ |
| --- | --- |
| −10 | 88 |
| −5 | 24 |
| 0 | 7 |
| 1 | 7 |
| 3 | 4 |
| 7 | 11 |
| 10 | x (stop of discharge) |

From this result, it can be found that there is a sufficient effect for reducing the number of spheroidal projections by starting the flow of cooling water within about 10 minutes from the start of discharge. When the dielectric windows were cooled sufficiently at the start of discharge (i.e., instances of −10 minutes and −5 minutes in Table 1), the films deposited on the dielectric windows became powdery at the early time of discharge, causing the film exfoliation in continuing the discharge to attach to the surfaces of the substrates and to produce spheroidal projections. Also, if the dielectric windows were not cooled for some time after the start of discharge, the films deposited on the dielectric windows were crystallized under the influence of the heat, causing the breakage of the dielectric windows. Accordingly, it has been found that there is an optimal value for the time from the start of discharge to the start of the flow of cooling water. It can be seen that if the flow of cooling water to cool the dielectric windows was started within 0 to 7 minutes, from the start time of discharge as the reference, excellent results could be obtained in any instance.

EXPERIMENTAL EXAMPLE 2

Using an apparatus for forming deposited films with the microwave plasma CVD method as above described and shown in FIGS. 1 to 3, the deposited films were formed on the substrates, according to the conditions as indicated in Table 2, to fabricate an amorphous silicone photosensitive drum which is a photoreceptor for electrophotography. Note that the cooling of the dielectric windows was started by passing the cooling water therethrough at the same time as the start of discharge.

TABLE 2

| Film formation conditions | Layer configuration | | |
| --- | --- | --- | --- |
| | Charge injection blocking layer | Photo-sensitive layer | Surface layer |
| Flow of source gas | | | |
| SiH$_4$ | 800 sccm | 800 sccm | 50 sccm |
| H$_2$ | 200 sccm | 200 sccm | 200 sccm |
| B$_2$H$_6$/SiH$_4$ | 1000 ppm | 5 ppm | 0 ppm |
| CH$_4$ | 0 sccm | 0 sccm | 600 sccm |
| Pressure | 6.0 mtorr | 6.0 mtorr | 6.0 mtorr |

TABLE 2-continued

| Film formation conditions | Layer configuration | | |
| --- | --- | --- | --- |
| | Charge injection blocking layer | Photo-sensitive layer | Surface layer |
| Microwave power | 2.4 kW | 2.4 kW | 2.0 kW |
| Film thickness | 3 μm | 25 μm | 0.5 μm |

By mounting a photosensitive drum taken out onto the NP7500 type electronic copying machine made by Canon Inc. reconstructed for this experiment, the evaluation for the fabricated photosensitive drum was performed in the following manner as described below, by forming images on a transfer paper in the normal copying process. Note that a voltage of 6 kV was applied to an electrostatic charger for the electronic copying machine. The evaluation was performed for six photosensitive drums, and their averages are shown in Table 3.

a) Reproducibility of fine line

An ordinary original containing only characters written on a white ground was set on an original board and copied, and observing samples of copied images obtained, the evaluation was performed as to how the fine line on an image sample was continuous without any interruptions. When there was some unevenness on the image sample, the evaluation was made over the entire image area, and the results for a portion in the worst image state were shown. The reference of the evaluation was such that ⊙ was "excellent", ○ was "partially interrupted", Δ was "many interruptions but recognizable as the character" and x was "partly unrecognizable as the character".

b) White fog

An ordinary original containing only characters written on a white ground was set on the original board and copied, and observing samples of copied images obtained, the evaluation was performed for the fogging on the white ground. The reference of the evaluation was such that ⊙ was "excellent", ○ was "partially slightly fogged", Δ was "fogged on overall surface but no trouble to recognize the character", and x was "greatly fogged to be unrecognizable as the character".

c) Image unevenness

An original of half tone on the overall surface was set on the original board and copied, and observing image samples obtained, the evaluation for the unevenness of densities was performed. The reference of evaluation was such that ⊙ was "excellent", ○ was "partially slightly difference of densities", Δ was "difference of densities on overall surface but no trouble to recognize the character", and x was "unevenness of densities to be unrecognizable as the character".

d) Defects of image

A black original was set on the original board and copied, and observing image samples obtained, the evaluation was performed using the number of white points within the same area. The reference of evaluation was such that ⊙ was "excellent", ○ was "partially small white points", Δ was "white points on overall surface but no trouble to recognize the character", and x was "a number of white points to be unrecognizable as the character".

TABLE 3

| | Reproducibility of fine line | Fog on white ground | Image unevenness | Image defects |
|---|---|---|---|---|
| Experimental example 2 | ◎ | ◎ | ◎ | ◎ |
| Comparative example 2 | ◎ | ◎ | ○ | △ |
| Experimental example 3 | ◎ | ◎ | ◎ | ◎ |

COMPARATIVE EXAMPLE 1

Figure 4:
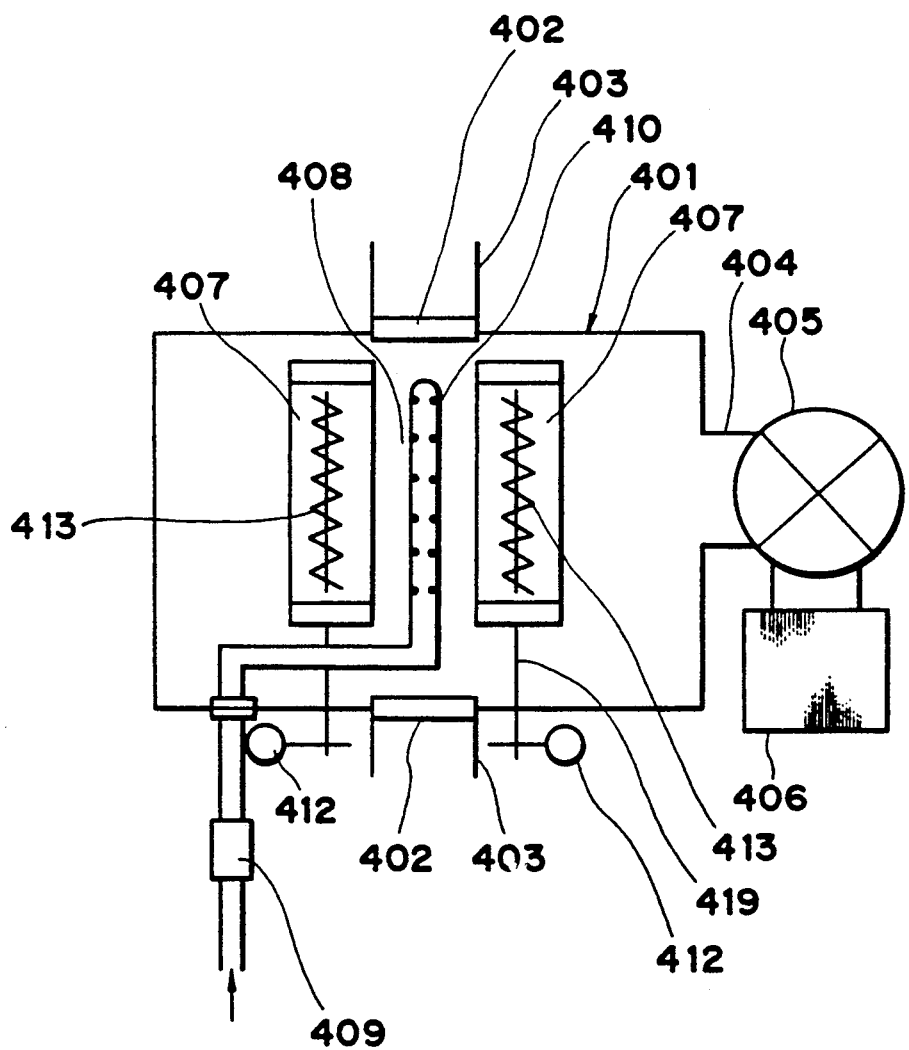
FIG. 4 is a schematic view illustrating a configuration of a conventional apparatus for forming deposited films.

Using a conventional apparatus for forming deposited films as shown in FIG. 4, an amorphous silicone photosensitive drum was fabricated under the conditions as indicated in Table 2 and as above described. As a result, dielectric windows were broken during the formation of deposited films, so that the photosensitive drum could not be fabricated.

COMPARATIVE EXAMPLE 2

Using a conventional apparatus for forming deposited films as shown in FIG. 4, an amorphous silicone photosensitive drum was fabricated under the conditions as indicated in Table 2, and the evaluation for the fabricated photosensitive drum was performed in the same manner as in experimental example 2. Its results are shown in Table 3.

TABLE 4

| Film formation conditions | Layer configuration | | |
|---|---|---|---|
| | Charge injection blocking layer | Photosensitive layer | Surface layer |
| Flow of source gas | | | |
| $SiH_4$ | 200 sccm | 200 sccm | 40 sccm |
| $H_2$ | 1000 sccm | 1000 sccm | 1000 sccm |
| $B_2H_6/SiH_4$ | 1000 ppm | 6 ppm | 0 ppm |
| $CH_4$ | 0 sccm | 0 sccm | 200 sccm |
| Pressure | 3.0 mtorr | 3.0 mtorr | 3.0 mtorr |
| Microwave power | 1200 W | 1200 W | 1200 W |
| Film thickness | 3 μm | 25 μm | 0.5 μm |

As will be apparent from the above experimental examples and comparative examples, in the apparatus for forming deposited films with the microwave plasma CVD method according to the present invention, it is possible to fabricate the photosensitive drum without losing the characteristics as a photosensitive drum even with an increased flow of silane gas which is a source gas, i.e., at an increased deposition rate. On the contrary, when the conventional apparatus for forming deposited films was used, the photosensitive drum could not be fabricated as dielectric windows were broken with the increased deposition rate. Although the evaluation items of the number of spheroidal projections and the image defect are closely related, it can be found from the above evaluation that the number of spheroidal projections can be sufficiently reduced in the present invention.

Further, when the amorphous silicone photosensitive drum was continuously fabricated, the number of photosensitive drums which could be fabricated within the same period in the experimental example 2 was three or more times that in the comparative example 2.

EXPERIMENTAL EXAMPLE 3

Using an apparatus for forming deposited films with the microwave plasma CVD method as above described and shown in FIGS. 1 to 3, the deposited films were formed on the substrates, according to the conditions as indicated in Table 5, to fabricate an amorphous silicone carbide photosensitive drum which is a photoreceptor for electrophotography. Note that the cooling of the dielectric windows was started by passing the cooling water therethrough at the same time as the start of discharge. The same evaluation as in the experimental example 2 was performed for the fabricated photosensitive drum. Its results are shown in Table 3. As will be clear from the table, satisfactory results were obtained for all the items.

TABLE 5

| Film formation conditions | Layer configuration | | |
|---|---|---|---|
| | Charge transporting layer | Photosensitive layer | Surface layer |
| Flow of source gas | | | |
| $SiH_4$ | 800 sccm | 800 sccm | 160 sccm |
| $H_2$ | 1000 sccm | 1000 sccm | 1000 sccm |
| $B_2H_6/SiH_4$ | 10 ppm | 1.0 ppm | 0 ppm |
| $CH_4$ | 160 sccm | 0 sccm | 800 sccm |
| Pressure | 5.0 mtorr | 4.5 mtorr | 5.0 mtorr |
| Microwave power | 2.4 kW | 2.4 kW | 2.4 kW |
| Film thickness | 30 μm | 5 μm | 0.5 μm |

The above experimental examples are to use the apparatus for forming deposited films with the microwave plasma CVD method according to the present invention for the fabrication of a photoreceptor for electrophotography using an amorphous silicone or amorphous silicone carbide, but this apparatus allows for the mass production of the amorphous silicone deposited films, relatively thick, particularly 10 μm or greater in thickness, with a high quality. The apparatus of the invention also provides the improvements in the mass productivity and the quality of deposited films, in forming a variety of functional deposited films, other than amorphous silicone deposited films for a photoreceptor for electrophotography, for example, deposited films as element members for use with semiconductor devices, image input line sensors, image pickup devices, photovoltaic devices, other various electronic or optical devices, with the microwave plasma CVD method.

What is claimed is:

1. An apparatus for forming deposited films with a microwave plasma CVD method having a reactor vessel within which the pressure can be reduced, means for supplying a source gas into said reactor vessel, means for introducing the microwave into said reactor vessel and exciting a microwave discharge plasma, and means for holding a plurality of substrates so as to enclose a discharge space formed within said reactor vessel, characterized by comprising a holding member holding together dielectric windows for introducing the microwave into said reactor vessel, substrates for the formation of deposited films disposed so as to surround said dielectric windows and a cooling device for cooling said dielectric windows, and conveying means for conveying said holding member into and out of said reactor vessel in a vacuum atmosphere.

2. The apparatus for forming deposited films according to claim 1, wherein, in addition to said reactor vessel, there are provided a vacuum vessel for the heating of said substrates, a vacuum vessel for the transportation of said substrates, and a vacuum vessel for the cooling of said substrates.

* * * * *